(12) United States Patent
Ma et al.

(10) Patent No.: US 7,336,743 B2
(45) Date of Patent: Feb. 26, 2008

(54) AUTOMATIC GAIN CONTROL AND ITS CONTROLLING METHOD

(75) Inventors: Kuang-Ping Ma, Hsin-Chu (TW);
Chia-Yung Chiu, Hsin-Chu (TW);
Wen-Tso Huang, Hsin-Chu (TW);
Albert Chen, Hsin-Chu (TW)

(73) Assignee: Intergrated Systems Solution Corp., Hsin-Chu (TW)

( * ) Notice: Subject to any disclaimer, the term of this patent is extended or adjusted under 35 U.S.C. 154(b) by 720 days.

(21) Appl. No.: 10/798,393

(22) Filed: Mar. 12, 2004

(65) Prior Publication Data

US 2005/0201497 A1 Sep. 15, 2005

(51) Int. Cl.
*H04L 27/08* (2006.01)
(52) U.S. Cl. .................... 375/345; 455/234.1
(58) Field of Classification Search ............... 375/345; 455/234.1, 239.1, 245.1, 250.1
See application file for complete search history.

(56) References Cited

U.S. PATENT DOCUMENTS 6,420,934 B1   7/2002  Butler et al.
6,748,200 B1 *  6/2004  Webster et al. .......... 455/234.1

* cited by examiner

*Primary Examiner*—Kevin Kim
(74) *Attorney, Agent, or Firm*—Birch, Stewart, Kolash & Birch, LLP

(57) ABSTRACT

An automatic gain control and its method are disclosed. An average power computing unit computes the power of a received signal. A power range monitoring unit monitors its change. If the signal power fluctuates around a threshold, the system enters an acquisition mode and the gain is tuned back to a default value. If the signal power is above an upper limit of a tracking range, a gain decreasing unit reduces the gain. If the signal power goes below a lower limit of the tracking range, a gain increasing unit raises the gain. Once the power falls in the tracking range, the system enters a tracking mode to make immediate responses toward the gain of the received signal.

10 Claims, 12 Drawing Sheets

AUTOMATIC GAIN CONTROL AND ITS CONTROLLING METHOD

BACKGROUND OF THE INVENTION

1. Field of Invention

The invention relates to an automatic gain control and its controlling method. In particular, the invention relates to a rapid automatic gain control and its controller method used in a wireless communication network.

2. Related Art

In a wireless communication network, the distances among devices and the obstacles in between are different. Therefore, the intensity change cannot be known in advance. The received signal has to be tuned to a default value so that the receiver reaches its optimized dynamic range. A common method is to use an automatic gain control (AGC). In a wireless local area network (WLAN) system, the AGC adjusts the intensity of the received signal to a predetermined level according to the preamble at the beginning of a packet. Because of the existence of noises and interference, the estimate of the required gain has a certain error. The error will result in errors in the adjusted signal. To prevent this from happening, only a step size is adjusted at a time, approaching the predetermined level by multiple adjustments.

FIG. 1 shows a schematic view of how the AGC in the prior art functions. When performing automatic gain controls, a simulated signal is amplified by a variable gain amplifier (VGA) 10. Converted by an analog-digital converter (ADC) 20 into a digital signal, the simulated signal is sent to the AGC 30. The AGC 30 generally contains an average power computing unit 310, a logic control unit 320, and a tracking unit 330. The tracking unit 330 includes a comparing device 3301, a step-size adjusting unit 3302, and a loop filter 3303. The average power computing unit 310 computes the average power of the currently received signal. Under the control of the logic control unit 320, the average power is compared with a target power by the comparing device 3301 (implemented by, e.g., an adder). It is adjusted by the step-size adjusting unit 1202 (implemented by, e.g., a multiplier). A certain proportion enters the loop filter 1203 to be converted by a digital-analog converter (DAC) into an analog signal. The analog signal controls the control voltage of the VGA to adjust the gain. The main objective of the control loop is to adjust the voltage of the signal so that it falls within the dynamic range when it enters the ADC.

Using the above-mentioned step-size tracking method can gradually approach the target gain, yet it takes a longer time. For some systems that require fast gain adjustments, this method is not satisfactory. Therefore, how to quickly adjust the gain is an important issue.

In reality, the estimate of the average power has a certain error because of the influence of noises and interference. Therefore, one has to take into account the characteristics of the gain adjusting loop. In general, the loop design has to consider the following two factors: (1) the converging speed of the gain adjustments; and (2) the error of gain adjustments. One important factor is the choice of the step size.

As shown in FIG. 2, if one selects a smaller step the gain can be tuned to a more accurate range. However, it takes a longer time. When one selects a bigger step, as shown in FIG. 3, the gain can be quickly tuned close to the target gain. Nonetheless, the accuracy is worse. From the analyses shown in FIGS. 2 and 3, the gain adjustment has two modes: acquisition and tracking. When the gain is far from the target gain, the adjustment had better to use the quick acquisition mode. When the gain is close to the target gain, the adjustment step has to be reduced in order not to be over-tuned. This is then the tracking mode. FIG. 4 shows an ideal gain adjustment example. An important factor to achieve such an ideal adjustment is: using the large-step adjustment when the gain is far from the target gain while using small-step adjustment when the gain is close to the target gain.

In a WLAN system, data transmissions are in the form of packets. The receiving end cannot know when to start receiving a packet. The receiver may be turned on at any point. Therefore, the receiver has to tune the gain according to the received signal intensity at that time. If the signal intensity varies after the system has finished tuning the gain, the gain tuner still has to be able to tune to an appropriate value in a relatively short time. FIG. 5 shows an example illustrating the gain variation when a receiver receives noises followed by a packet.

In reality, the receiver cannot know when a packet is entering the receiver. The most important factor for rapid convergence in gain tuning is that the gain tuner is able to enter the acquisition mode to quickly adjust its gain in large steps. Consequently, the gain tuner should be able to accurately determine when to enter the acquisition mode and when to switch to the tracking mode.

The U.S. Pat. No. 6,420,934 discloses an automatic gain control circuit. As shown in FIG. 6, the signal amplified by the AGC 601 goes through a receive signal strength indicator (RSSI) 604 to indicate the strength of the received signal. By using a comparing device 605 to compare the signal with various predetermined thresholds, the strength of the received signal is determined. A determination logic 606 uses the result to determine whether the AGC should enter the quick acquisition mode or the small-step tracking mode. However, this method cannot accurately compute the real strength when the signal saturates and experiences clipping. Due to the influence of noises and errors, the selection of the thresholds is not an easy task.

SUMMARY OF THE INVENTION

To solve the above-mentioned problems, the invention provides an automatic gain control (AGC) and its controlling method in order to quickly respond to the strength variation of the received signal, speeding up the gain adjustment process.

The invention provides an AGC for wireless communication networks. It uses the signal saturation property to determine whether the system should enter the acquisition mode. The AGC includes: an average power computing unit for computing the average power of a received signal; a power range monitoring unit for monitoring the power range variation of the received signal; a logic unit for controlling the signal transmission in the AGC according to the power range variation; a tracking unit for gain tracking according to the control of the logic unit; and a acquisition unit for gain acquisition according to the control of the logic unit. The acquisition unit further contains a gain returning unit for tuning the current gain back to a default value; a gain increasing unit for increasing the current gain; and a gain decreasing unit for decreasing the current gain.

The invention provides an automatic gain control method for a wireless communication network. It uses the signal saturation property to determine whether the system should enter the acquisition mode. The method first computes the average power of a received signal and monitors the power range variation of the received signal. When the signal power increases from below a saturation threshold to above the saturation threshold, the system enters the acquisition mode. The current gain is adjusted back to a default value. The system then computes the average power again. If the monitored power does not fall in a tracking range, the gain is increased or decreased accordingly. Once the signal average power falls into the tracking range, the system enters the gain tracking mode to tracking control the gain.

The invention utilizes the signal saturation propeity to determine when to enter the acquisition mode. Therefore, it can make accurate judgments in time. By gain returning and tuning in steps, the influence of noises and computational errors can be apparently reduced. The gain is thus tuned to within the range of the tracking mode.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 7:
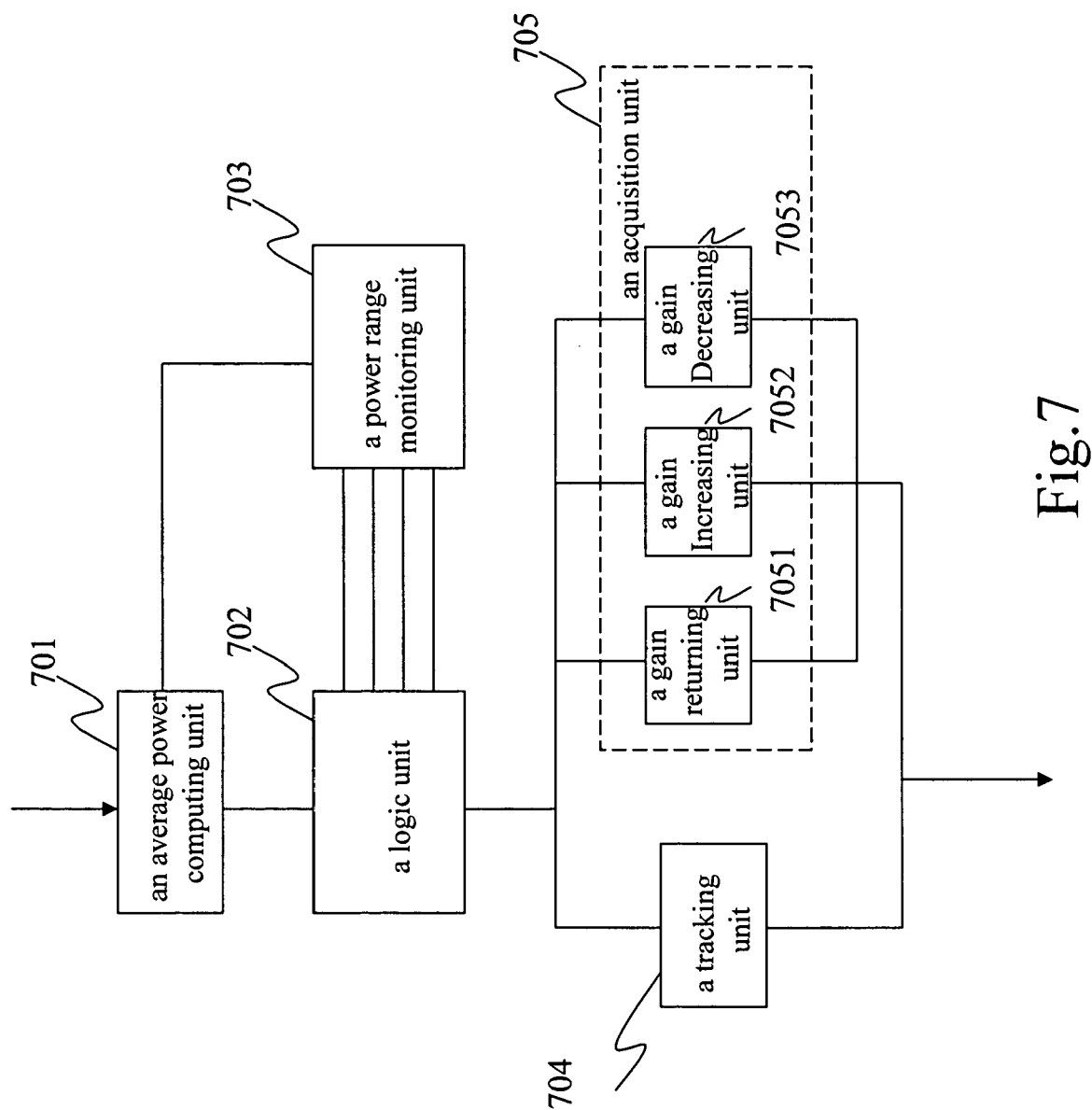
FIG. 7 is a schematic view of the AGC according to the invention.

FIG. 7 shows the structure of the automatic gain control (AGC). The AGC includes an average power computing unit 701, a logic unit 702, a power range monitoring unit 703, a tracking unit 704, and an acquisition unit 705. The acquisition unit 705 further includes a gain returning unit 7051, a gain increasing unit 7052, and a gain decreasing unit 7053.

The average power computing unit 701 computes the average power of a received signal. The power range monitoring unit 703 monitors the power range variation of the received signal. The logic unit 702 controls the signal transmission within the AGC according to the variation of the monitored power range. The tracking unit 704 performs gain tracking according to the control of the logic unit. The acquisition unit 705 performs gain acquisition according to the control of the logic unit. The gain returning unit 7051 returns the current gain back to a default value. The gain increasing unit 7052 increases the current gain. The gain decreasing unit 7053 decreases the current gain.

The power range monitored by the power range monitoring unit 703 are: varying from below a saturation threshold to above the saturation threshold, larger than the upper limit of a tracking range, smaller than the lower limit of the tracking range, and falling within the tracking range.

When the power range monitoring unit 703 observes that the power of the received signal changes from below a saturation threshold to above the saturation threshold, the logic unit 702 switches the AGC to the acquisition mode. The gain is adjusted by the gain returning unit 7051 back to a default value.

When the power range monitoring unit 703 observes that the power of the received signal is greater than the upper value of the tracking range, the logic unit 702 makes the gain decreasing unit 7053 reduce the current gain in the acquisition mode according to a default step value.

When the power range monitoring unit 703 observes that the power of the received signal is smaller than the upper value of the tracking range, the logic unit 702 makes the gain increasing unit 7052 raise the current gain in the acquisition mode according to a default step value.

When the power range monitoring unit 703 observes that the power of the received signal falls within the tracking range, the logic unit 702 switches the AGC to the tracking mode for gain tracking.

Figure 8:
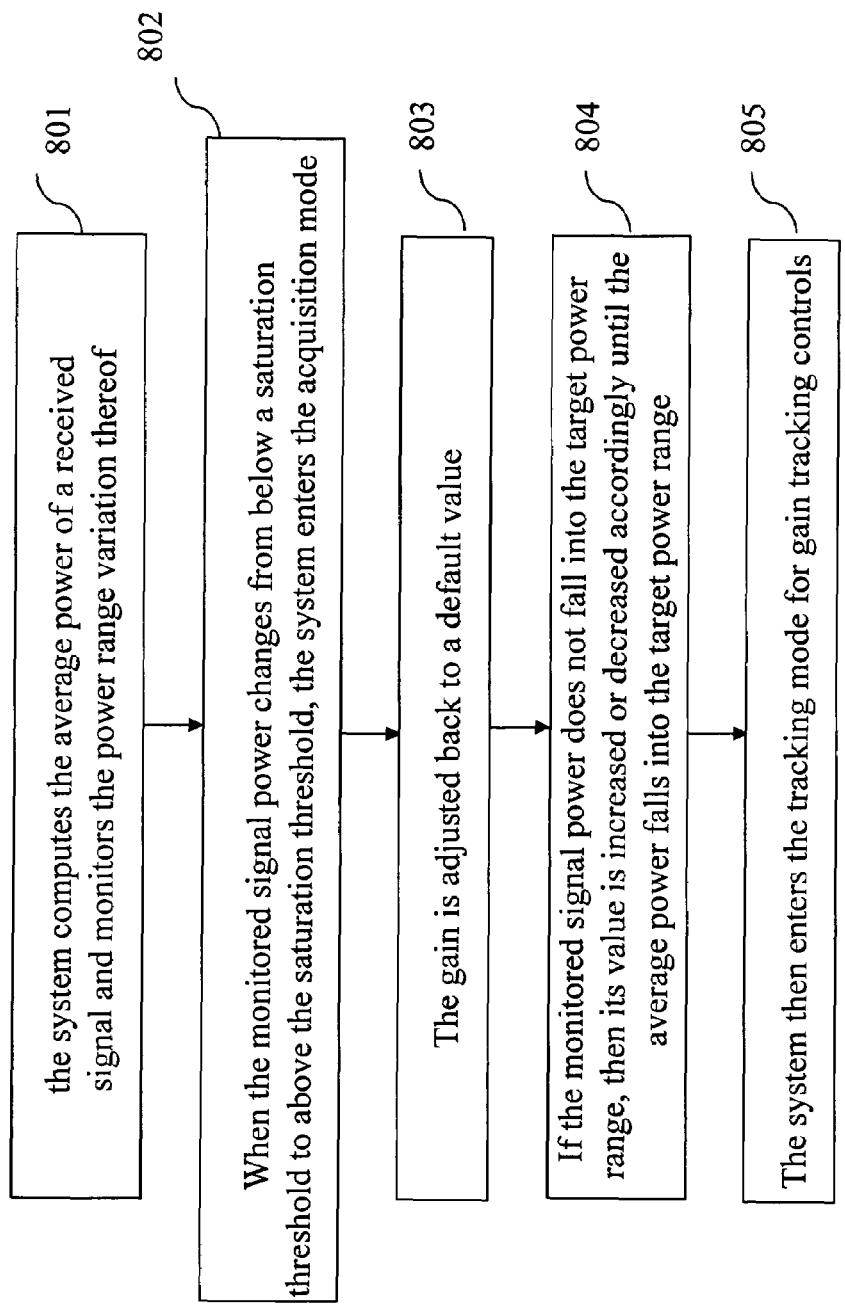
FIG. 8 is a flowchart of the disclosed AGC method.

With reference to FIG. 8, the invention also provides an AGC method. First, the system computes the average power of a received signal and monitors the power range variation thereof (step 801). When the monitored signal power changes from below a saturation threshold to above the saturation threshold, the system enters the acquisition mode (step 802). The gain is adjusted back to a default value (step 803). Afterwards, the system computes the average power of the signal again. If the monitored signal power does not fall into the target power range, then its value is increased or decreased accordingly until the average power falls into the target power range (step 804). The system then enters the tracking mode for gain tracking controls (step 805).

In particular, after the AGC enters the acquisition mode, the gain is reduced when the received signal power is greater than the upper limit of the tracking range whiles increased when the received signal power is smaller than the lower limit of the tracking range. The gain increase or decrease can be done according to a default step value.

Figure 1:
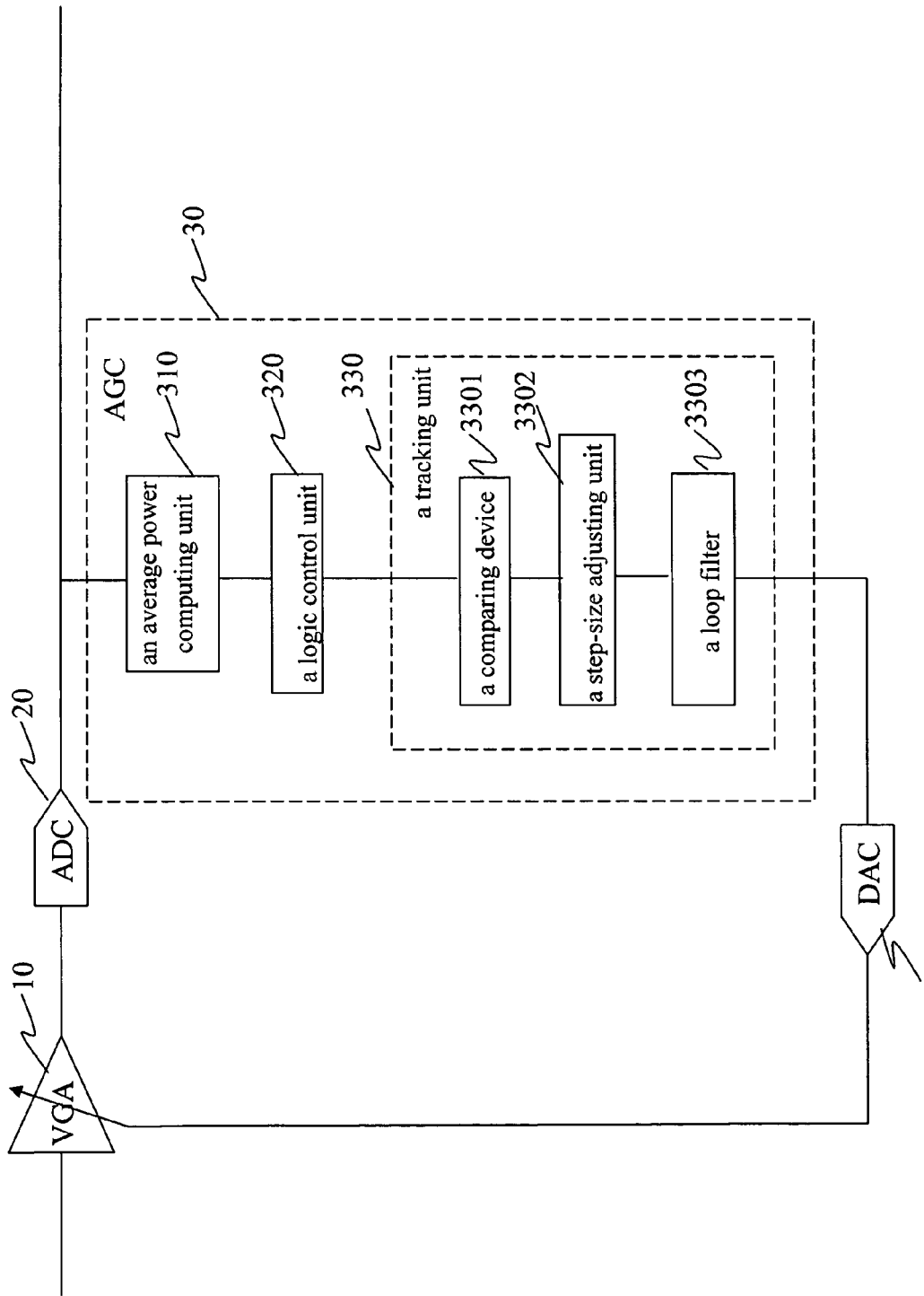
FIG. 1 is a schematic view of the AGC in the prior art.
Figure 2:
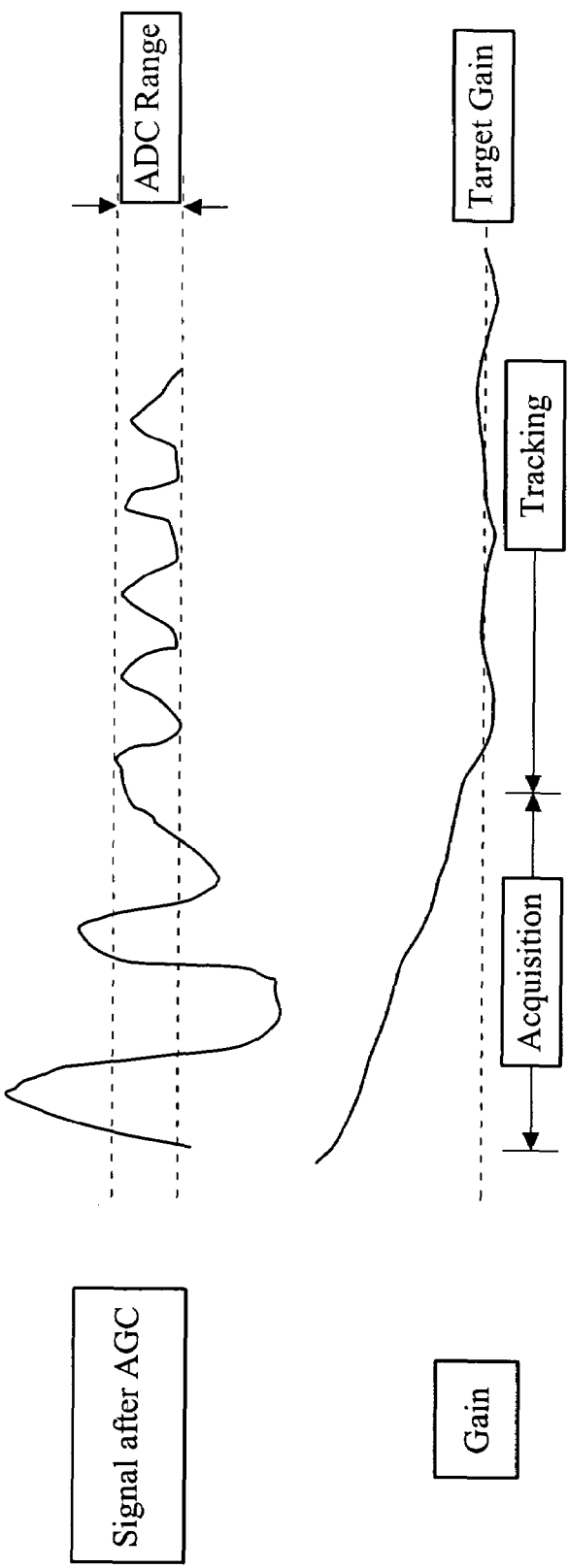
FIG. 2 is a loop characteristic curve of using small steps to tune the gain.
Figure 3:
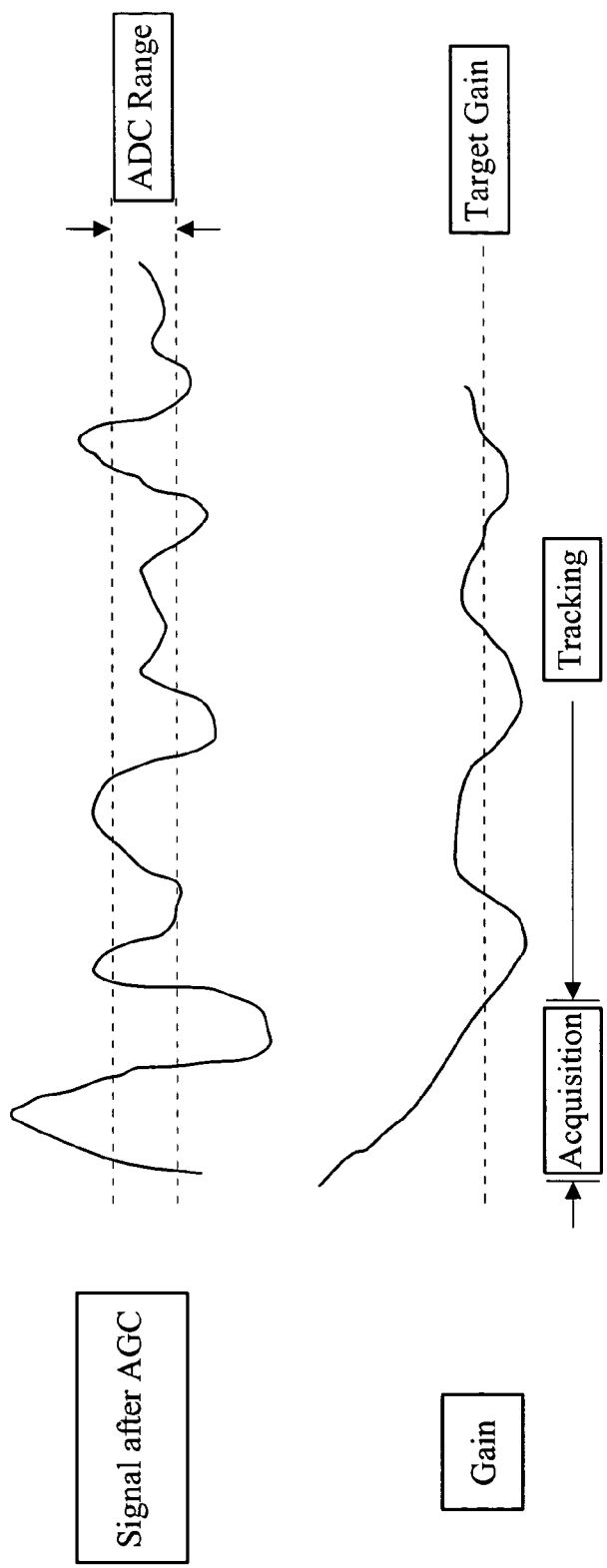
FIG. 3 is a loop characteristic curve of using big steps to tune the gain.
Figure 4:
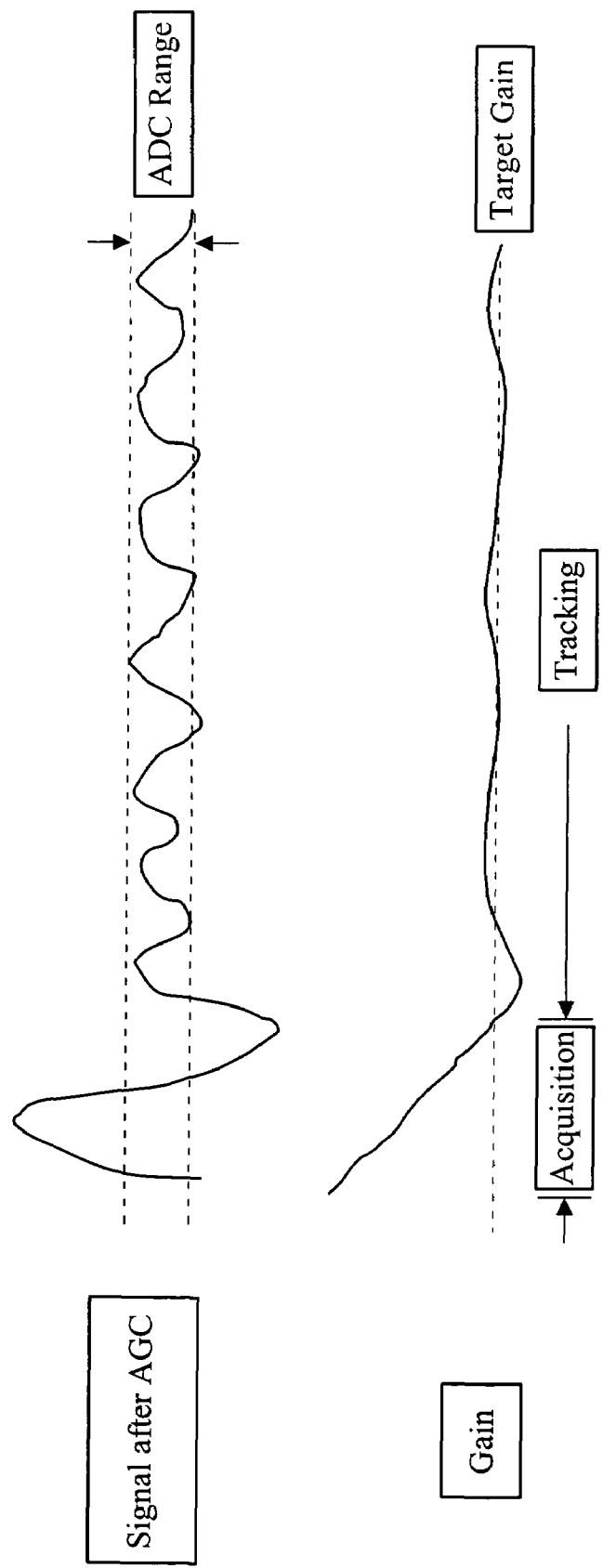
FIG. 4 is a loop characteristic curve of using big steps to rough-tune and small steps to fine-tune the gain.
Figure 5:
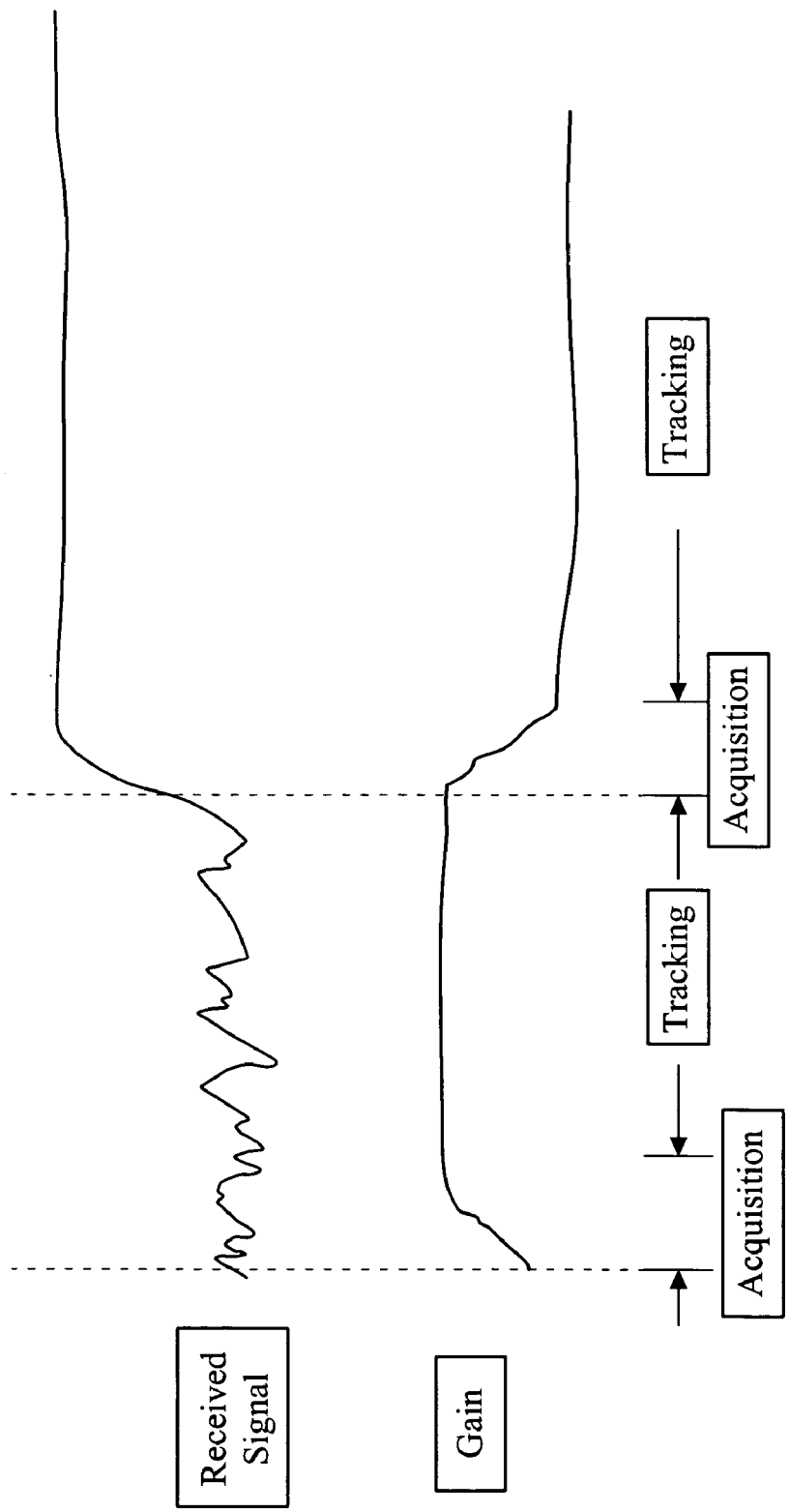
FIG. 5 is a curve of the gain variation when a receiver first receives a noise signal and then a packet.
Figure 6:
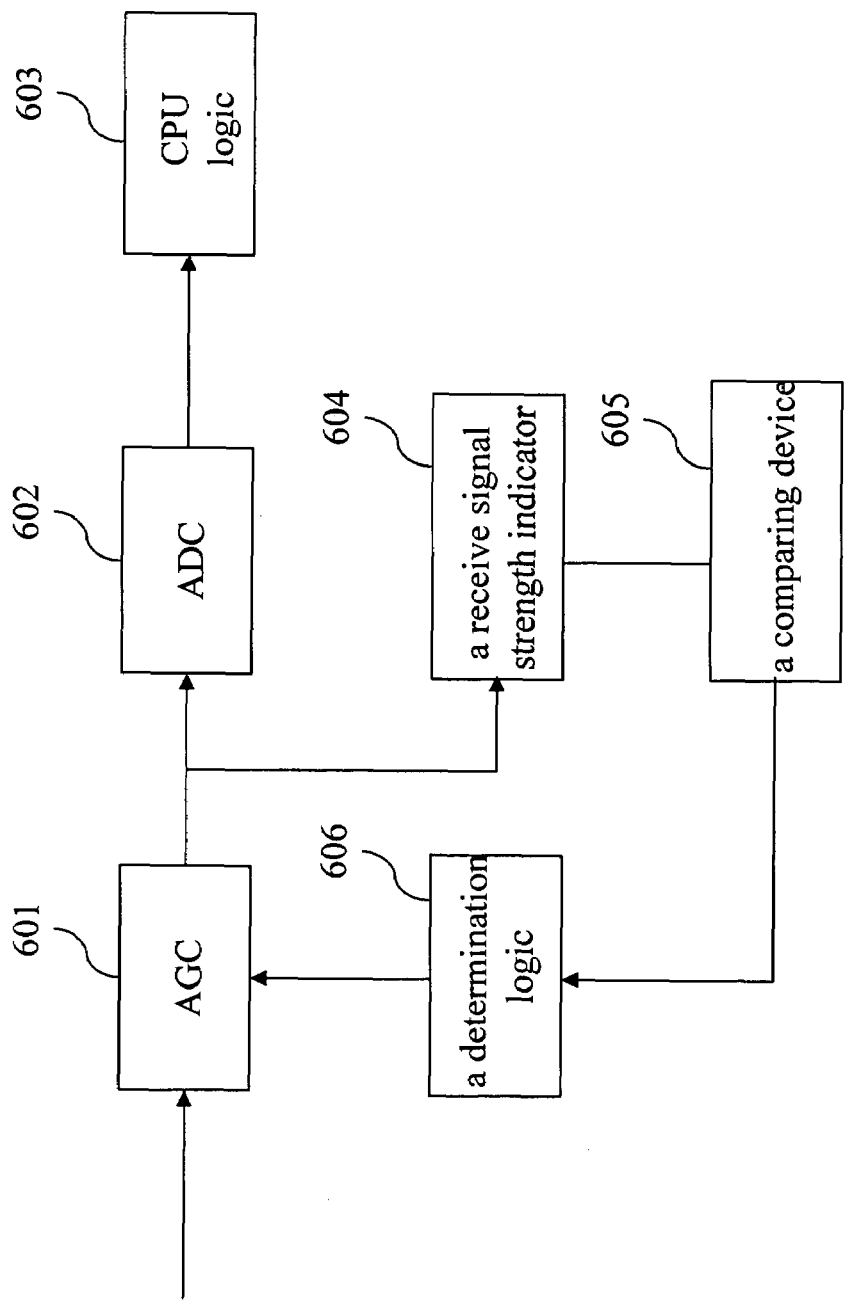
FIG. 6 is a schematic view of the AGC circuit disclosed in the U.S. Pat. No. 6,420,934.
Figure 9:
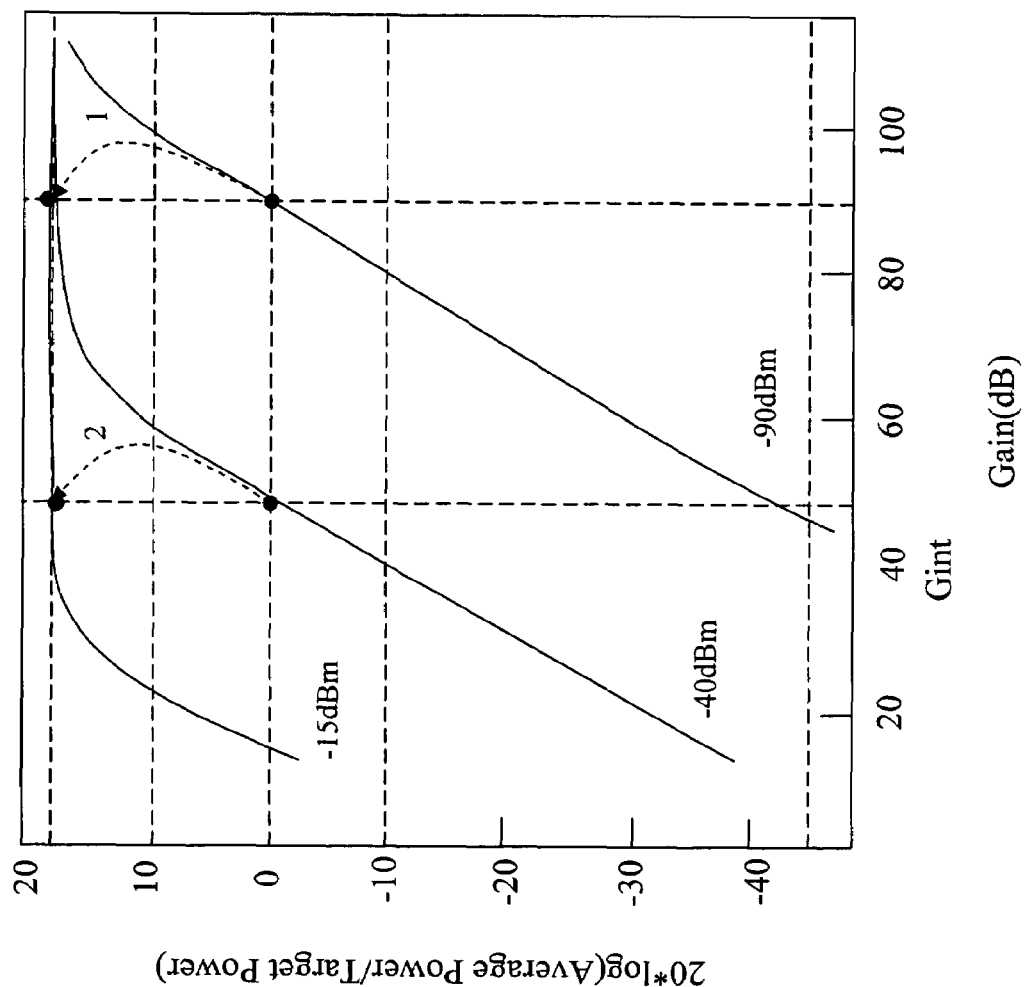
FIG. 9 shows the variations in the average power and the gain of IEEE802.11g signals of different strengths after amplification and clipping.

In a WLAN embodiment, as shown in FIG. 5, suppose the AGC has tuned the gain to an appropriate range during the noise section. When a packet enters, the power of the packet is greater than that of the noises. Therefore, using the gain for the noises to amplify the packet will result in the phenomenon that the packet signal voltage exceeds the upper limit acceptable by the analog-digital converter (ADC). This will further result in clipping and errors in average power computation. In this case, the receiving intensity computation is not accurate. FIG. 9 shows the variation of the average power and the gain for IEEE802.11g signals of different strengths after amplification and clipping. From the drawing, we know that the average power also saturates and that the saturation average power is the same. Therefore, the saturation average power may be used to detect whether the signal intensity has a big change, thereby determining whether the AGC should enter the acquisition mode.

Let's use FIG. 9 as an example. Suppose the noise power is −90 dBm and the packet power is −15 dBm. When the noise is tuned to a target power, the gain is about 90 dB.

When the packet enters (path 1), using the gain to amplify the packet results in clipping of the signal. The computed average power is around 17 dB. If a saturation threshold (e.g. 15 dB) is set as the standard for determining when to enter the acquisition mode, the AGC then enters the acquisition mode. It is noted that the current gain value is still far from the target gain.

If the noise power is −40 dBm and the packet power is −15 dBm, the gain for the noise to be tuned to the target power is about 50 dB. When a packet enters (path 2), using the gain to amplify the packet also results in clipping of the signal. The computed average power is also around 17 dB. The AGC also determines to enter the acquisition mode. However, the current gain value is not too far from the target gain.

From the above two examples, we see that the computed average power can help determine whether the gain is varied too much and results in signal clipping. However, because of this saturation property, the distance from the current gain to the target is still unknown.

Figure 10:
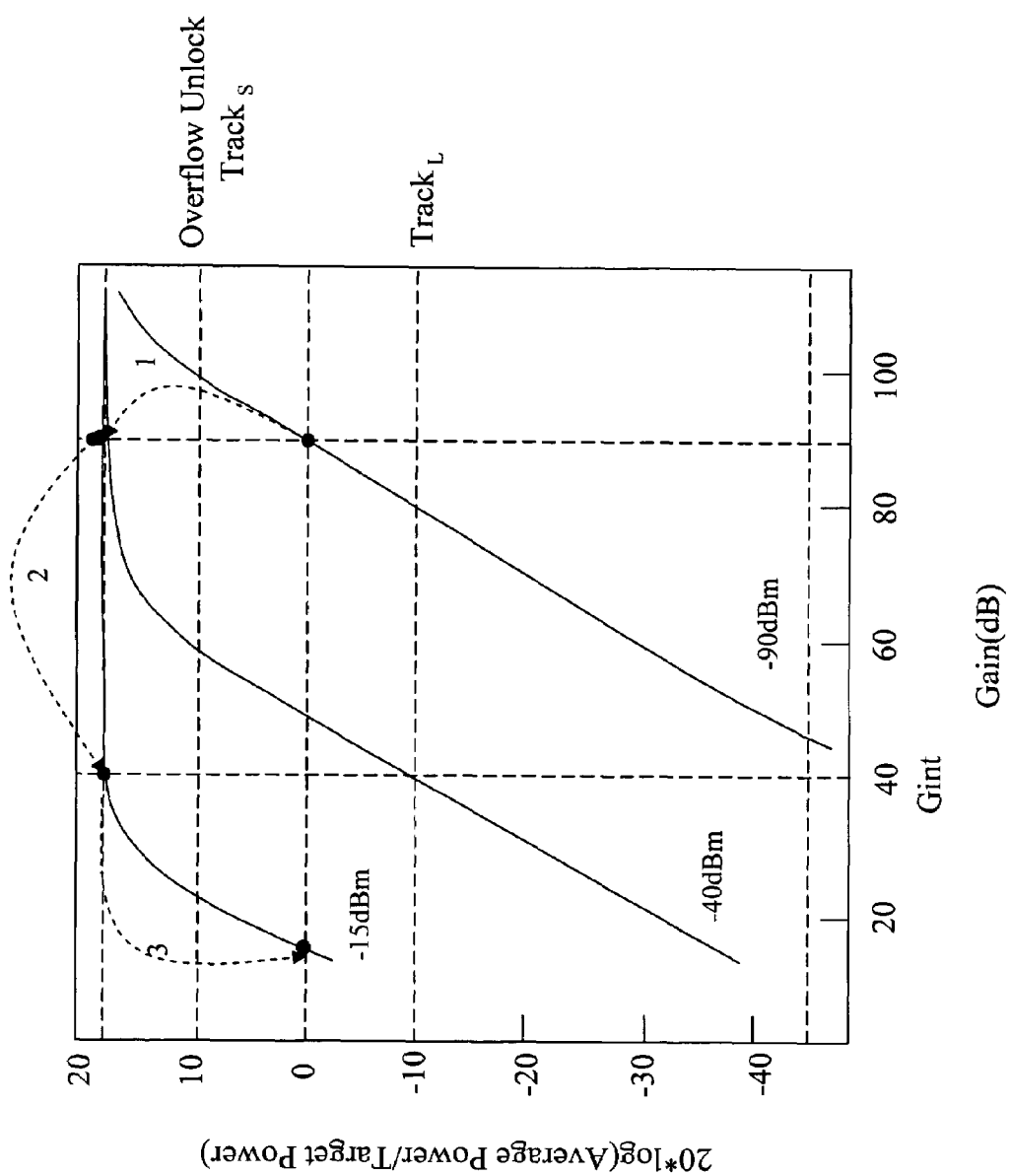
FIG. 10 shows the process of tuning the gain in an embodiment with a noise power of −90 dBm and a packet power of −15 dBm.

At this moment, the strategy of gain returning and fixed-step tuning can be used to significantly modify the gain. With reference to FIG. 10, the noise gain is −90 dBm and the packet power is −15 dBm. Suppose the gain has been adjusted to the target gain 90 dB in the noise section. When a packet enters, the computed average power jumps to a saturation power exceeding the threshold (overflow unlock). The system determines to enter the acquisition mode (path 1). In this case, no matter what the gain is, it is returned to a default value $G_{init}$ (path 2). If the computed average power is still greater than the threshold, the gain is gradually decreased by a default step until it falls within a tracking range (path 3).

Figure 11:
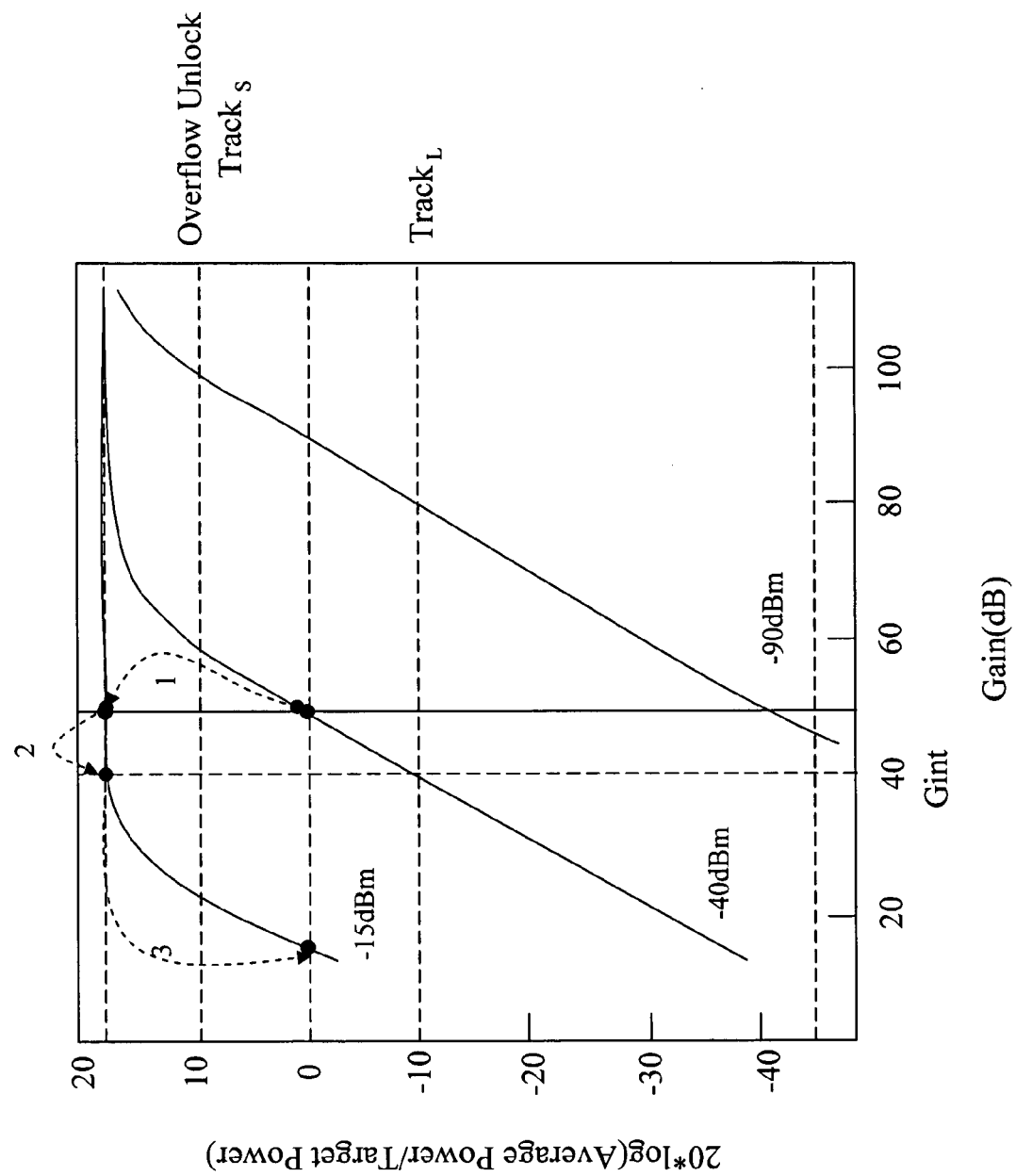
FIG. 11 shows the process of tuning the gain in an embodiment with a noise power of −40 dBm and a packet power of −15 dBm.

With reference to FIG. 11, the noise power is −40 dBm and the packet power is −15 dBm. Suppose the gain has been adjusted in the noise section to a target gain 50 dB. When a packet enters, the computed average power jumps to the saturation power exceeding the threshold. The system determines to enter the acquisition mode (path 1). The gain is returned to $G_{init}$ (path 2). At this moment, the computed average power is still greater than the threshold. The gain is gradually decreased by a default step until it falls within a tracking range (path 3).

Figure 12:
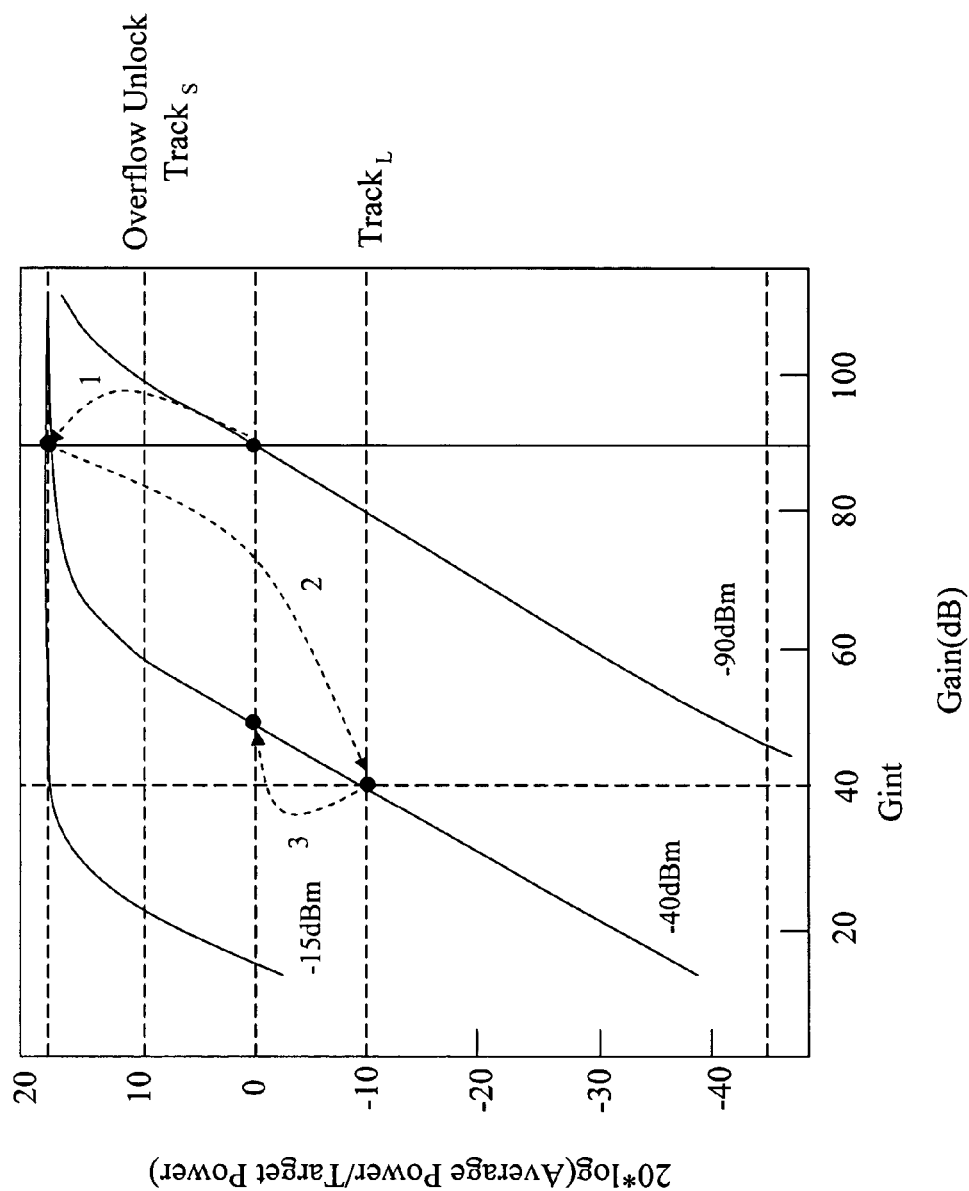
FIG. 12 shows the process of tuning the gain in an embodiment with a noise power of −90 dBm and a packet power of −40 dBm.

With reference to FIG. 12, the noise power is −90 dBm and the packet power is −40 dBm. Suppose the gain has been adjusted in the noise section close to a target gain 90 dB. When a packet enters, the computed average power jumps to the saturation power exceeding the threshold. The system determines to enter the acquisition mode (path 1). The gain is returned to $G_{init}$ (path 2). At this moment, the computed average power is smaller than the tracking range. The gain is increased by a value (e.g. the difference between the estimated average power and the target power) to fall into the tracking range (path 3).

Certain variations would be apparent to those skilled in the art, which variations are considered within the spirit and scope of the claimed invention.

What is claimed is:

1. An automatic gain control (AGC) for a wireless communication network to use the signal saturation property as a standard for entering an acquisition mode for quick gain tuning, the AGC comprising:
   an average power computing unit, which computes the average power of a received signal;
   a power range monitoring unit, which monitors the power range variation of the received signal;
   a logic unit, which controls the signal transmission within the AGC according to the variation of the power range;
   a tracking unit, which performs gain tracking according to the control of the logic unit; and
   an acquisition unit, which performs gain acquisition according to the control of the logic unit, wherein the acquisition unit further comprises:
   a gain returning unit, which returns the current gain to a default value;
   a gain increasing unit, which increases the current gain; and
   a gain decreasing unit, which decreases the current gain.

2. The AGC of claim 1, wherein the logic unit switches the AGC to the acquisition mode when the power of the received signal monitored by the power range monitoring unit changes from below a saturation threshold to above the saturation threshold and notifies the gain returning unit to tune the gain to a default gain value.

3. The AGC of claim 1, wherein the logic unit notifies the gain decreasing unit to decrease the current gain by a default step in the acquisition mode when the power of the received signal monitored by the power range monitoring unit is greater than the upper limit of a tracking range.

4. The AGC of claim 1, wherein the logic unit notifies the gain increasing unit to increase the current gain by a default step in the acquisition mode when the power of the received signal monitored by the power range monitoring unit is smaller than the lower limit of a tracking range.

5. The AGC of claim 1, wherein the logic unit switches the AGC to a tracking mode for gain tracking when the power of the received signal monitored by the power range monitoring unit falls within the tracking range.

6. An automatic gain control (AGC) method for a wireless communication network to use the signal saturation property as a standard for entering an acquisition mode for quick gain tuning, the AGC method comprising the steps of:
   computing the average power of a received signal and monitoring the power range variation of the received signal;
   entering the acquisition mode when the monitored signal power changes from below a saturation threshold to above the saturation threshold;
   returning the current gain back to a default gain under the acquisition mode;
   re-computing the signal average power and, if the monitored power still does not fall within a tracking range, tuning the current gain accordingly until the signal average power falls within the tracking range; and
   entering a gain tracking mode for gain tracking when the signal average power falls within the tracking range.

7. The AGC method of claim 6, wherein the current gain is decreased when the received signal power is greater than the upper limit of the tracking range after the AGC enters the acquisition mode.

8. The AGC method of claim 7, wherein the step of decreasing the current gain reduces the current gain by a default step.

9. The AGC method of claim 6, wherein the gain is increased when the received signal power is smaller than the lower limit of the tracking range after the AGC enters the acquisition mode.

10. The AGC method of claim 9, wherein the step of increasing the current gain raises the current gain by a default step.

* * * * *